(12) United States Patent
Roberts et al.

(10) Patent No.: US 11,236,422 B2
(45) Date of Patent: Feb. 1, 2022

(54) MULTI ZONE SUBSTRATE SUPPORT FOR ALD FILM PROPERTY CORRECTION AND TUNABILITY

(71) Applicant: LAM RESEARCH CORPORATION, Fremont, CA (US)

(72) Inventors: Michael Philip Roberts, Tigard, OR (US); Ramesh Chandrasekharan, Portland, OR (US); Pulkit Agarwal, Beaverton, OR (US); Aaron Bingham, Newberg, OR (US); Ashish Saurabh, Haryana (IN); Ravi Kumar, Providence, RI (US); Jennifer Leigh Petraglia, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 207 days.

(21) Appl. No.: 16/192,425

(22) Filed: Nov. 15, 2018

(65) Prior Publication Data

US 2019/0153600 A1 May 23, 2019

Related U.S. Application Data

(60) Provisional application No. 62/609,077, filed on Dec. 21, 2017, provisional application No. 62/587,943, filed on Nov. 17, 2017.

(51) Int. Cl.
*C23C 16/455* (2006.01)
*H01L 21/67* (2006.01)
(Continued)

(52) U.S. Cl.
CPC .... *C23C 16/45544* (2013.01); *C23C 16/4586* (2013.01); *C23C 16/45527* (2013.01);
(Continued)

(58) Field of Classification Search
CPC ........ C23C 16/45544; C23C 16/45527; C23C 16/4586; C23C 16/46; C23C 16/52;
(Continued)

(56) References Cited

U.S. PATENT DOCUMENTS

| 4,780,120 A | 10/1988 | Varrasso et al. |
| 5,071,459 A | 12/1991 | Kuhn |

(Continued)

FOREIGN PATENT DOCUMENTS

| JP | H07153550 A | 6/1995 |
| JP | H10116885 A | 5/1998 |

(Continued)

OTHER PUBLICATIONS

Rendon, G., et al., "A Simple Substrate Heater Device With Temperature Controller for Thin Film Preparation". Journal of Applied Research and Technology, vol. 10, Aug. 2012, pp. 549-556.*

(Continued)

*Primary Examiner* — Bret P Chen

(57) ABSTRACT

A substrate processing system configured to perform a deposition process on a substrate includes a substrate support including a plurality of zones and a plurality of resistive heaters arranged throughout the plurality of zones. The plurality of resistive heaters includes separately-controllable resistive heaters arranged in respective ones of the plurality of zones. A controller is configured to, during the deposition process, control the plurality of resistive heaters to selectively adjust temperatures within the plurality of zones.

8 Claims, 7 Drawing Sheets

(51) Int. Cl.
*C23C 16/52* (2006.01)
*C23C 16/46* (2006.01)
*C23C 16/458* (2006.01)

(52) U.S. Cl.
CPC .............. *C23C 16/46* (2013.01); *C23C 16/52* (2013.01); *H01L 21/6719* (2013.01); *H01L 21/67098* (2013.01); *H01L 21/67103* (2013.01); *H01L 21/67126* (2013.01); *H01L 21/67248* (2013.01)

(58) Field of Classification Search
CPC ......... H01L 21/67098; H01L 21/67103; H01L 21/67126; H01L 21/6719; H01L 21/67248
See application file for complete search history.

(56) References Cited

U.S. PATENT DOCUMENTS

| | | | | |
|---|---|---|---|---|
| 5,126,533 | A * | 6/1992 | Newman | H01L 39/2422 219/200 |
| 5,280,422 | A | 1/1994 | Moe et al. | |
| 5,521,850 | A | 5/1996 | Moe et al. | |
| 5,968,379 | A | 10/1999 | Zhao et al. | |
| 5,974,816 | A | 11/1999 | Endo | |
| 6,072,163 | A | 6/2000 | Armstrong et al. | |
| 6,627,859 | B1 | 9/2003 | Kasai et al. | |
| 6,783,630 | B2 | 8/2004 | Shajii et al. | |
| 6,897,411 | B2 * | 5/2005 | Beer | H01L 21/67103 118/50.1 |
| 6,951,587 | B1 | 10/2005 | Narushima | |
| 7,189,946 | B2 * | 3/2007 | Goto | H01L 21/67103 219/444.1 |
| 7,196,295 | B2 | 3/2007 | Fennewald et al. | |
| 7,705,275 | B2 * | 4/2010 | Umotoy | C23C 16/466 219/401 |
| 8,405,005 | B2 * | 3/2013 | Zucker | H01L 21/67248 219/444.1 |
| 8,552,346 | B2 | 10/2013 | Ambal et al. | |
| 8,772,682 | B2 | 7/2014 | Ambal et al. | |
| 9,123,755 | B2 | 9/2015 | Swanson et al. | |
| 9,490,150 | B2 * | 11/2016 | Tzu | H05B 3/143 |
| 2003/0062359 | A1 * | 4/2003 | Ho | H01L 21/67248 219/444.1 |
| 2005/0028736 | A1 | 2/2005 | Long | |
| 2005/0194374 | A1 * | 9/2005 | Gelatos | H05B 3/283 219/444.1 |
| 2005/0258160 | A1 | 11/2005 | Goto et al. | |
| 2006/0284722 | A1 | 12/2006 | Bernier | |
| 2007/0006936 | A1 * | 1/2007 | Hosokawa | H01L 21/67201 141/8 |
| 2007/0218200 | A1 | 9/2007 | Suzuki et al. | |
| 2008/0078744 | A1 | 4/2008 | Wang et al. | |
| 2008/0224817 | A1 | 9/2008 | Vellore et al. | |
| 2009/0159566 | A1 * | 6/2009 | Brillhart | C23C 14/505 216/58 |
| 2010/0193501 | A1 * | 8/2010 | Zucker | H01L 21/67248 219/443.1 |
| 2010/0267248 | A1 * | 10/2010 | Ma | H01L 21/3105 438/787 |
| 2011/0092072 | A1 * | 4/2011 | Singh | H01L 21/6833 438/710 |
| 2011/0143462 | A1 * | 6/2011 | Gaff | H01J 37/20 438/9 |
| 2012/0118225 | A1 | 5/2012 | Hsu et al. | |
| 2012/0208371 | A1 * | 8/2012 | Rogers | H01J 37/321 438/758 |
| 2012/0258602 | A1 * | 10/2012 | Subramani | H01L 21/28079 438/758 |
| 2013/0037532 | A1 * | 2/2013 | Volfovski | H05B 3/145 219/385 |
| 2013/0180963 | A1 | 7/2013 | Zhang et al. | |
| 2013/0220989 | A1 * | 8/2013 | Pease | H01L 21/67103 219/458.1 |
| 2013/0270252 | A1 | 10/2013 | Ambal et al. | |
| 2014/0083361 | A1 | 3/2014 | Rocha-Alvarez et al. | |
| 2014/0154819 | A1 * | 6/2014 | Gaff | H01L 21/67109 438/17 |
| 2014/0220710 | A1 * | 8/2014 | Aderhold | H01L 21/324 438/5 |
| 2014/0251214 | A1 * | 9/2014 | Cuvalci | G01K 3/10 118/712 |
| 2015/0083042 | A1 | 3/2015 | Kobayashi et al. | |
| 2015/0170977 | A1 * | 6/2015 | Singh | H01L 21/67103 438/16 |
| 2016/0079039 | A1 | 3/2016 | Dhindsa et al. | |
| 2016/0148803 | A1 | 5/2016 | Wu et al. | |
| 2016/0379851 | A1 | 12/2016 | Swaminathan et al. | |
| 2017/0215230 | A1 | 7/2017 | Parkhe | |
| 2017/0236733 | A1 | 8/2017 | Leeser | |
| 2017/0280509 | A1 | 9/2017 | Takebayashi | |
| 2017/0363663 | A1 | 12/2017 | Breitlow et al. | |
| 2017/0365443 | A1 * | 12/2017 | Carducci | H01J 37/32009 |
| 2017/0372928 | A1 * | 12/2017 | Yamada | H01L 21/67248 |
| 2018/0090306 | A1 | 3/2018 | Higashijima et al. | |
| 2018/0190529 | A1 | 7/2018 | Takebayashi et al. | |
| 2018/0246163 | A1 | 8/2018 | Kwak et al. | |
| 2018/0337074 | A1 * | 11/2018 | Samir | H01J 37/32715 |
| 2018/0348265 | A1 | 12/2018 | Hopkins-Breitlow et al. | |

FOREIGN PATENT DOCUMENTS

| | | | |
|---|---|---|---|
| JP | 2000235886 A | 8/2000 | |
| JP | 2000339039 A | 12/2000 | |
| JP | 5567318 B2 | 8/2014 | |
| JP | 2017076691 A | 4/2017 | |
| JP | 2017228230 A | 12/2017 | |
| KR | 20-2009-0003703 U | 4/2009 | |
| KR | 10-2017-0088352 A | 8/2017 | |
| KR | 10-2018-0035151 A | 4/2018 | |
| WO | WO 2014/113230 * | 7/2014 | .......... H01L 21/683 |
| WO | WO-2018016384 A1 | 1/2018 | |

OTHER PUBLICATIONS

Patil, Nagesh D., et al., "Effects of Substrate Heating and Wettability on Evaporation Dynamics and Deposition Patterns for a Sessile Water Droplet Containing Colloidal Particles". Langmuir, 2016, 32, 11958-11972.*

Perez, Israel, et al., "Design and construction of a compact rotary substrate heater for deposition systems". Can. J. Phys. 98: 1009-1014 (2020) dx.doi.org/10.1139/cjp-2019-0530.*

Rousseau, B., et al., "Resistive substrate heater for film processing by spray pyrolysis". Review of Scientific Instruments, vol. 75, No. 9, Sep. 2004, pp. 2884-2887.*

International Search Report and Written Opinion corresponding to PCT/US2019/030366 dated Aug. 13, 2019, 13 pages.

International Search Report and Written Opinion corresponding to PCT/US2019/045093 dated Nov. 15, 2019, 14 pages.

International Search Report and Written Opinion corresponding to PCT/US2019/045097 dated Dec. 20, 2019, 11 pages.

International Search Report and Written Opinion corresponding to PCT/US2019/040416 dated Oct. 23, 2019, 12 pages.

International Search Report and Written Opinion corresponding to PCT/US2018/061542 dated Mar. 8, 2019, 10 pages.

U.S. Appl. No. 62/694,171, filed Jul. 5, 2018, in the names of Sairam Sundaram et al.; & entitled "Dynamic Temperature Control of Substrate Support in Substrate Processing System", pp. 1-14. (Year 2018).

* cited by examiner

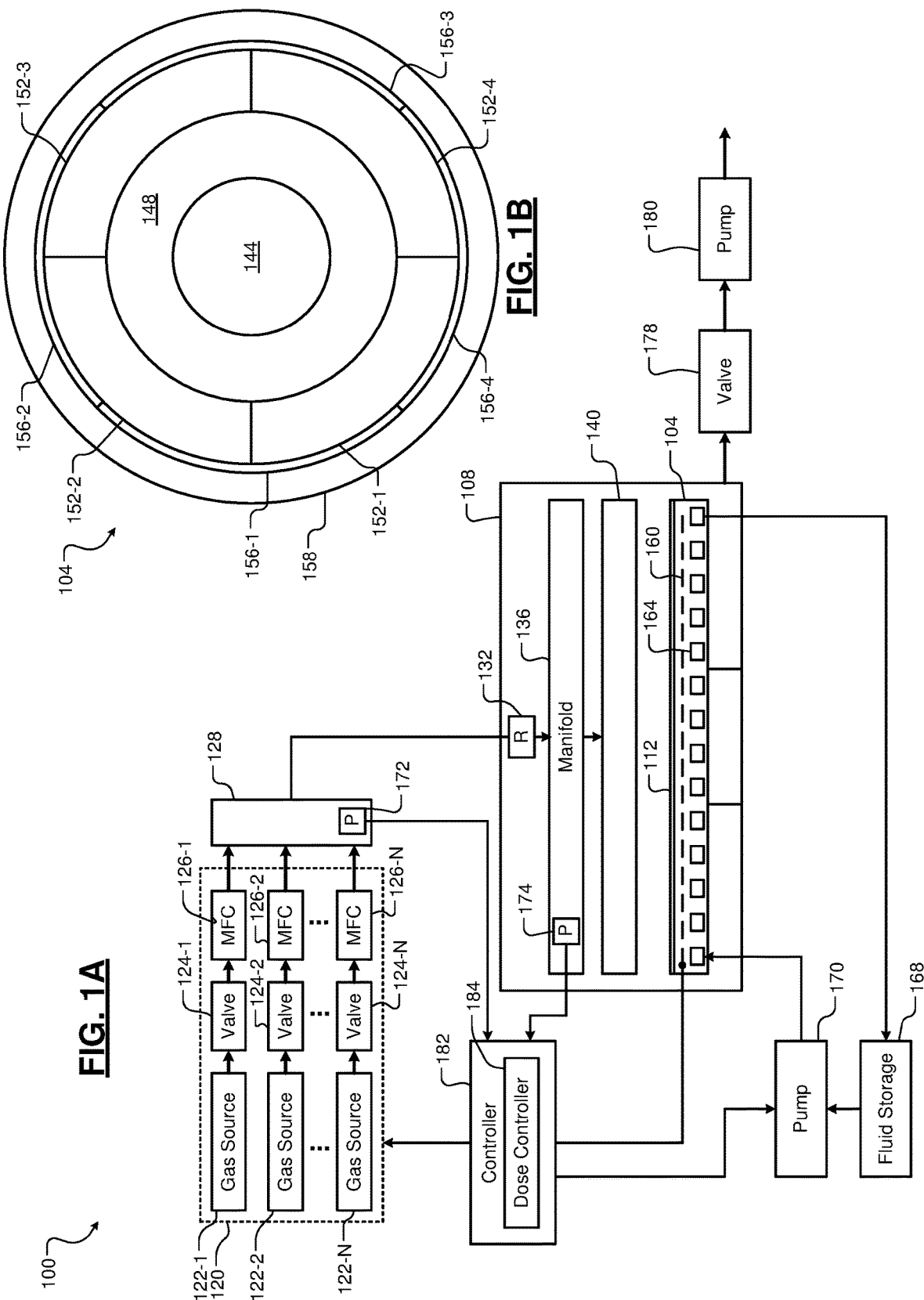

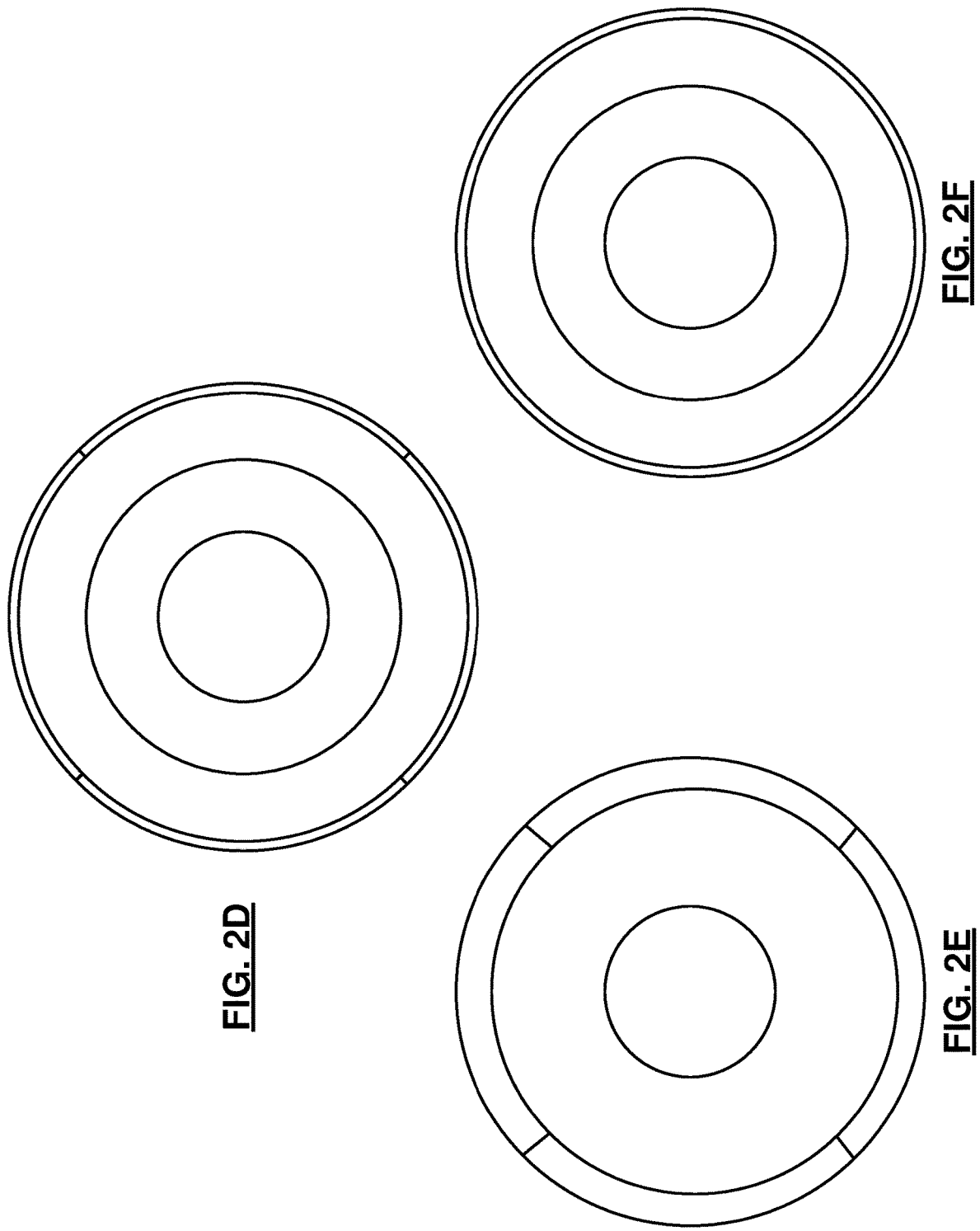

MULTI ZONE SUBSTRATE SUPPORT FOR ALD FILM PROPERTY CORRECTION AND TUNABILITY

CROSS-REFERENCE TO RELATED APPLICATIONS

This application claims the benefit of U.S. Provisional Application No. 62/587,943, filed on Nov. 17, 2017 and U.S. Provisional Application No. 62/609,077, filed Dec. 21, 2017. The entire disclosures of the applications referenced above are incorporated herein by reference.

FIELD

The present disclosure relates to a temperature tunable pedestal for an ALD substrate processing chamber.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Examples of substrate treatments include etching, deposition, photoresist removal, etc. During processing, the substrate is arranged on a substrate support such as an electrostatic chuck and one or more process gases may be introduced into the processing chamber.

The one or more processing gases may be delivered by a gas delivery system to the processing chamber. In some systems, the gas delivery system includes a manifold connected by one or more conduits to a showerhead that is located in the processing chamber. In some examples, processes use atomic layer deposition (ALD) to deposit a thin film on a substrate.

SUMMARY

A substrate processing system configured to perform a deposition process on a substrate includes a substrate support including a plurality of zones and a plurality of resistive heaters arranged throughout the plurality of zones. The plurality of resistive heaters includes separately-controllable resistive heaters arranged in respective ones of the plurality of zones. A controller is configured to, during the deposition process, control the plurality of resistive heaters to selectively adjust temperatures within the plurality of zones.

In other features, the deposition process is an atomic layer deposition (ALD) process and the substrate support is an ALD pedestal. The plurality of zones includes a central zone, at least one middle zone radially outside of the central zone, and at least one outer edge zone radially outside of the at least one middle zone. The at least one outer edge zone includes a first outer edge zone adjacent to the at least one middle zone and a second outer edge zone radially outside of the first outer edge zone. The at least one outer edge zone extends radially outside of an outer edge of the substrate.

In other features, the at least one middle zone includes a first plurality of azimuthal segments. The at least one outer edge zone includes a second plurality of segments offset from the first plurality of segments in an azimuthal direction. The second plurality of segments is offset from the first plurality of segments by 45 degrees. The substrate support includes a heater layer and the plurality of resistive heaters is embedded within the heating layer below an upper layer of the substrate support. At least a portion of the heater layer is provided radially outside of an edge of the substrate.

A substrate support for a substrate processing system configured to perform a deposition process on a substrate including a baseplate, a plurality of zones, and a heater layer provided on the baseplate. The heater layer includes a plurality of resistive heaters arranged throughout the plurality of zones. The plurality of resistive heaters includes separately-controllable resistive heaters arranged in respective ones of the plurality of zones. The plurality of zones includes a central zone, at least one middle zone radially outside of the central zone, and at least one outer edge zone radially outside of the at least one middle zone. The at least one outer edge zone extends radially outside of an outer edge of the substrate.

In other features, the deposition process is an atomic layer deposition (ALD) process and the substrate support is an ALD pedestal. The at least one outer edge zone includes a first outer edge zone adjacent to the at least one middle zone and a second outer edge zone radially outside of the first outer edge zone. The at least one middle zone includes a first plurality of azimuthal segments. The at least one outer edge zone includes a second plurality of azimuthal segments offset from the first plurality of azimuthal segments in an azimuthal direction. The second plurality of azimuthal segments is offset from the first plurality of azimuthal segments by 45 degrees. At least a portion of the heater layer is provided on a stepped portion of the baseplate. Only an outer edge of the substrate contacts an upper surface of the substrate support. The substrate is arranged on minimum contact area features of the substrate support.

A method of fabricating a substrate support for a substrate processing system configured to perform a deposition process on a substrate includes machining an upper plate to form a pocket within the upper plate and forming a heater layer within the pocket. Forming the heater layer includes bonding the heater layer onto an upper wall of the pocket and the heater layer includes a plurality of zones each including a separately-controllable resistive heater. The method further includes arranging a baseplate within the pocket. The baseplate is bonded within the pocket using a bonding material and the upper plate encloses the heater layer and the bonding material within a Faraday cage.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1A is a functional block diagram of an example of a substrate processing system including a multi-injector showerhead according to the present disclosure;

FIG. 1B shows heater zones of a substrate support according to the present disclosure;

FIGS. 2D, 2E, and 2F show other example heater zone arrangements according to the present disclosure;

In the drawings, reference numbers may be reused to identify similar and/or identical elements.

DETAILED DESCRIPTION

Figure 2B:
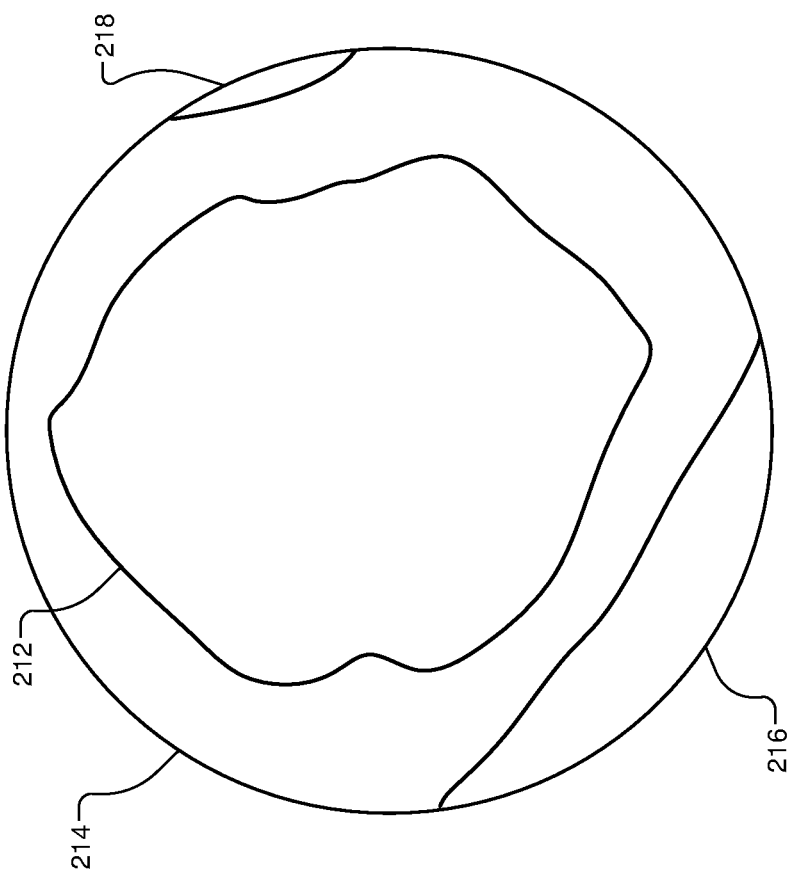
FIGS. 2A-2C show example deposition thickness non-uniformity profiles according to the present disclosure.

In film deposition processes such as atomic layer deposition (ALD), various properties of the deposited film vary across a spatial (i.e., x-y coordinates of a horizontal plane) distribution. For example, substrate processing tools may have respective specifications for film thickness non-uniformity (NU), which may be measured as a full-range, a half-range, and/or a standard deviation of a measurement set taken at predetermined locations on a surface of a semiconductor substrate. In some example, the NU may be reduced either by, for example, addressing a direct cause of the NU and/or introducing a counteracting NU to compensate and cancel the existing NU. In other examples, material may be intentionally deposited and/or removed non-uniformly to compensate for known non-uniformities at other (e.g. previous or subsequent) steps in a process. In these examples, a predetermined non-uniform deposition/removal profile may be calculated and used.

Various properties of deposited ALD films may be influenced by a temperature of the substrate during deposition. Systems and methods according to the principles of the present disclosure are configured to adjust a temperature distribution to reduce thickness NU. For example, the temperature distribution may be adjusted to compensate for a known NU of a particular substrate processing tool (which may be referred to as profile compensation), to generate a predetermined NU profile for use during a particular process (which may be referred to as profile tuning), etc.

For example, during an ALD process (e.g., deposition of an oxide film), a substrate is arranged on a substrate support such as an ALD pedestal. Typically, an ALD pedestal comprises a single zone. An ALD pedestal according to the principles of the present disclosure includes a multi-zone (e.g., from 2 to 20 or more zones) heater layer. The heater layer may be embedded within an upper layer of the pedestal. For example, the heater layer may comprise a polyimide and silicone heater layer that is at least partially enclosed in an aluminum upper layer (e.g., an upper layer configured to support/contact the substrate arranged on the substrate support). In this example, the arrangement of the aluminum upper layer may function as a Faraday cage. In other examples, the upper layer may be a ceramic layer (e.g., $Al_2O_3$, AlN, etc.). Each zone of the heater layer controls a temperature of a respective zone of the pedestal. The upper layer is arranged on a base (e.g., a baseplate) of the pedestal and heat may be transferred from the upper layer to the baseplate, which may be cooled.

An arrangement (e.g., quantity, shape, geometry, etc.) of the zones is configured to compensate for known film thickness NUs resulting from an ALD process. The zones may include, but are not limited to: two or more radial (i.e., annular) zones having different widths; two or more segmented radial zones (i.e., radial zones including multiple segments/azimuthal zones); an outer radial zone that is adjacent to and/or overlaps an edge of the substrate; and an outer radial zone arranged to adjust a temperature of a carrier ring (e.g. to control/correct radial profiles for deposition and/or removal through trimming). In one example, the zones include ten zones, including a central zone, an inner-mid radius zone, four outer-mid radius zones (i.e., an outer-mid radius zone comprising four segments), and four outer edge zones (i.e., an outer edge zone comprising four segments). In some examples, the radial zones may include more than four segments (e.g., eight or more). Further, the azimuthal zones of adjacent radial zones may not be aligned. Instead, the azimuthal zones of one radial zone may have a different rotational orientation (i.e., clocking) relative to adjacent radial zones.

Referring now to FIGS. 1A and 1B, an example of a substrate processing system 100 including a substrate support (e.g., an ALD pedestal) 104 according to the present disclosure is shown. The substrate support 104 is arranged within a processing chamber 108. A substrate 112 is arranged on the substrate support 104 during processing. In some examples, the substrate support 104 may be configured to minimize contact with the substrate 112 (e.g., only an outer edge of the substrate 112 may contact an upper surface of the substrate support 104, the substrate 112 may be arranged on minimum contact area (MCA) features, etc.). In other examples, the substrate support 104 may be configured to provide backside gas clamping.

A gas delivery system 120 includes gas sources 122-1, 122-2, ..., and 122-N (collectively gas sources 122) that are connected to valves 124-1, 124-2, ..., and 124-N (collectively valves 124) and mass flow controllers 126-1, 126-2, ..., and 126-N (collectively MFCs 126). The MFCs 126 control flow of gases from the gas sources 122 to a manifold 128 where the gases mix. An output of the manifold 128 is supplied via an optional pressure regulator 132 to a manifold 136. An output of the manifold 136 is input to a multi-injector showerhead 140. While the manifold 128 and 136 are shown, a single manifold can be used.

The substrate support 104 includes a plurality of zones. As shown, the substrate support 104 includes a central zone 144, an inner-mid radius zone 148, four outer-mid radius zones (i.e., an outer-mid radius zone 152 comprising four segments 152-1, 152-2, 152-3, and 152-4), and four outer edge zones (i.e., an outer edge zone 156 comprising four segments 156-1, 156-2, 156-3, and 156-4). The segments of the outer edge zone 156 are offset from (i.e., rotated with respect to) the segments of the outer-mid radius zone 152 (e.g., by 45°). In some examples, the substrate support 104 may include a second outer edge zone 158 radially outside of the outer edge zone 156. For example, an inner diameter of the second outer edge zone 158 may be greater than a diameter of the substrate 112. A temperature of the substrate support 104 may be controlled by using separately-controllable resistive heaters 160 arranged in respective ones of the zones as described below in more detail.

In some examples, the outer edge zone 156 overlaps and/or extends beyond (i.e., in a radial direction) an outer edge of the substrate 112. For example, for a 300 mm substrate, the radius of the outer edge zone 156 may be greater than 300 mm. Further, a width of the outer edge zone 156 (i.e., a distance from an inner radius to an outer radius) is less than a width of the inner-mid radius zone 148 and the outer-mid radius zone 152. For example, the width of the outer edge zone 156 may be approximately 10 mm (e.g., +/−2 mm) while the respective widths of the inner-mid radius zone 148 and the outer-mid radius zone 152 may be approximately 40 mm (e.g., +/−2 mm). The relatively narrow width of the outer edge zone 156 facilitates fine tuning at the outer edge of the substrate 112.

In some examples, the substrate support 104 may include coolant channels 164. Cooling fluid is supplied to the coolant channels 164 from a fluid storage 168 and a pump 170. Pressure sensors 172, 174 may be arranged in the manifold 128 or the manifold 136, respectively, to measure pressure. A valve 178 and a pump 180 may be used to evacuate reactants from the processing chamber 108 and/or to control pressure within the processing chamber 108.

A controller 182 includes a dose controller 184 that controls dosing provided by the multi-injector showerhead 140. The controller 182 also controls gas delivery from the gas delivery system 120. The controller 182 controls pressure in the processing chamber and/or evacuation of reactants using the valve 178 and the pump 180. The controller 182 controls the temperature of the substrate support 104 and the substrate 112 based upon temperature feedback (e.g., from sensors (not shown) in the substrate support and/or sensors (not shown) measuring coolant temperature).

Figure 2A:
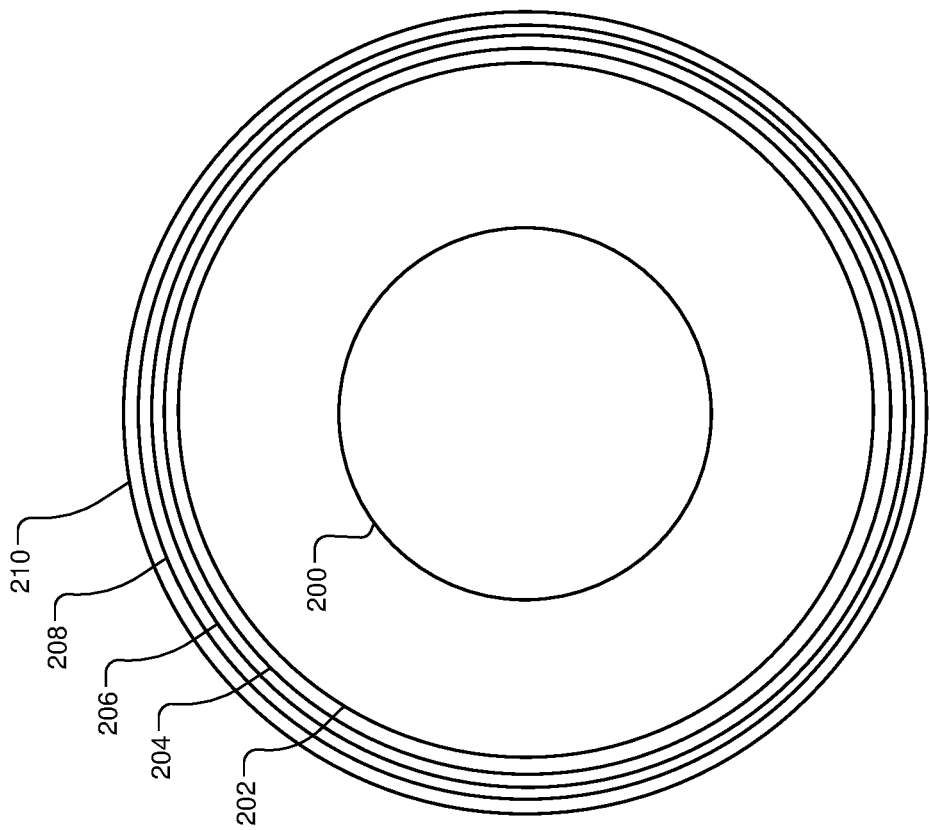
Figure 2C:
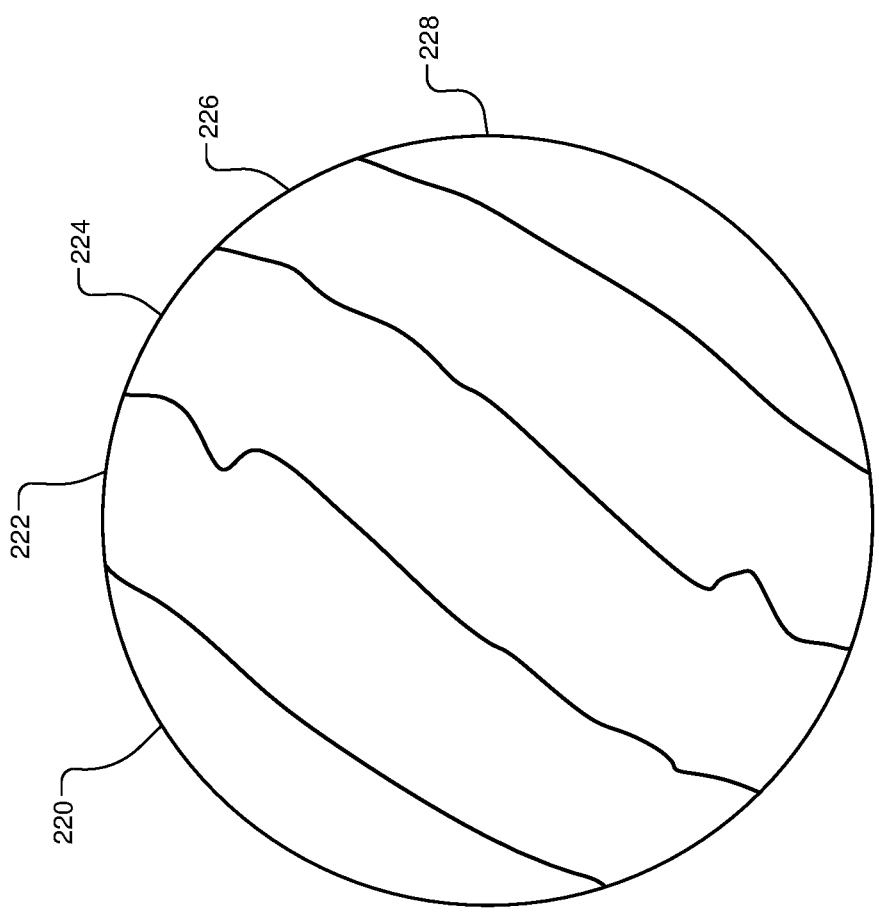

Referring now to FIGS. 2A, 2B, and 2C, example deposition thickness NU profiles are shown for different processes. For example, as shown in FIG. 2A, the thickness NUs are generally radial (e.g., the NUs may be generally dependent upon a distance from a center of the substrate and differ accordingly in regions 200, 202, 204, 206, 208, and 210). In other examples, the NUs may be both radial and azimuthal (e.g., in a rotational direction). For example, as shown in FIG. 2B, each of regions 212, 214, 216, and 218 may have different ranges of NUs. In still other examples, the NUs may be radial in only some directions. For example, as shown in FIG. 2C, each of regions 220, 222, 224, 226, and 228 may have different ranges of NUs. Further, in examples where the NUs are radial, the NUs may significantly increase in a narrow region at an outer edge of the substrate. Accordingly, two, three, or four uniform radial heater zones may not be able to compensate for all possible NU patterns.

The arrangement of the zones allow for compensation for both radial and azimuthal thickness NUs, as well as compensation for NUs at a narrow outer edge region of the substrate. For example only, FIGS. 2D, 2E, and 2F show other example zone arrangements. In other examples, the substrate support 104 may include other arrangements and combinations of radial and azimuthal zones. For example, the substrate support may 104 may include fewer (e.g., two) or more (e.g., 20 or more) zones, and each radial zone may be segmented into 2 to 8 or more separately controllable azimuthal zones to increase tunability.

The temperatures of the zones may be controlled according to a predetermined temperature control profile for a known NU profile. For example, one or more temperature control profiles may be stored (e.g., in the controller 182 and/or in memory accessible by the controller 182), input by a user, etc. Each of the temperature control profiles may be correlated to a predetermined NU profile (e.g., for a given process or recipe, processing chamber, etc.). According, during an ALD process, the heater zones may be individually controlled and adjusted to compensate for deposition NUs. The temperature control profiles correspond to target temperatures for each zone of the substrate support and may be calibrated according to expected temperature outputs of the zones for a given substrate support. In some examples, the temperature control profiles correlate a film property (e.g., thickness, deposition rate, etc.) and/or a temperature of the zone to one or more heater zone control parameters (e.g., duty cycle, percent output, etc.). Accordingly, a predetermined temperature control profile may be retrieved in accordance with a desired temperature distribution, film thickness, and/or other film property and the heater zones are controlled based on the heater zone control parameters in the retrieved temperature control profile.

Temperatures of respective heater zones may be controlled according to one or more types of feedback. In one example, each zone may include a respective temperature sensor. In another example, temperatures of each zone may be calculated. For example, a voltage and current of a resistive heater (e.g., using voltage and current sensors) may be measured to determine a resistance of the resistive heater. Since the resistance characteristics of the resistive heater are known, a temperature of the respective zone can be calculated based on a change in resistance caused by an associated change in temperature. In some examples, feedback may be provided using a combination of temperature sensors and calculations using other sensed or measured parameters such as voltage and current.

Figure 3A:
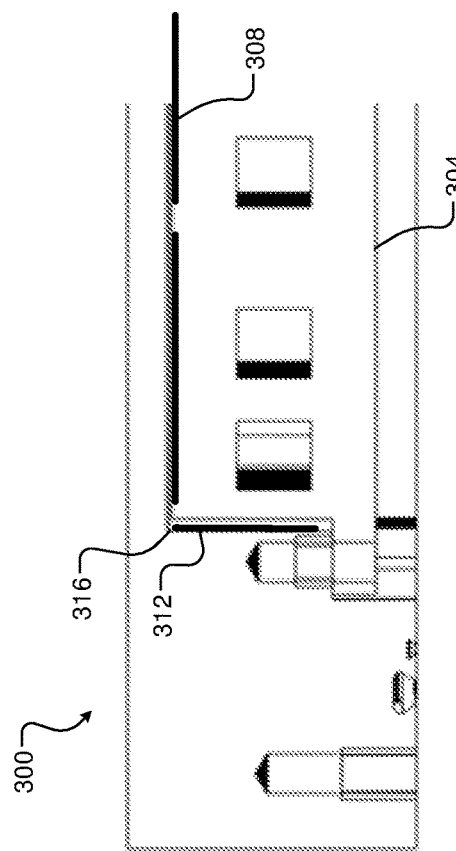
FIGS. 3A, 3B, 3C, and 3D show example heater zone configurations according to the present disclosure.
Figure 3B:
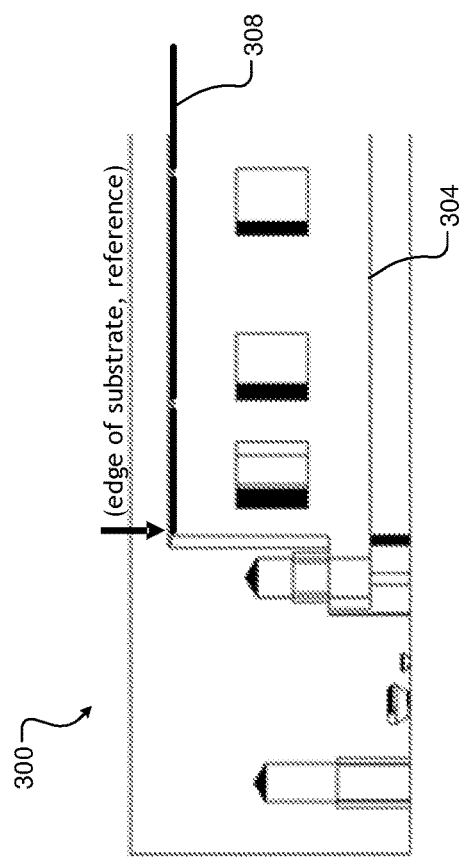
Figure 3C:
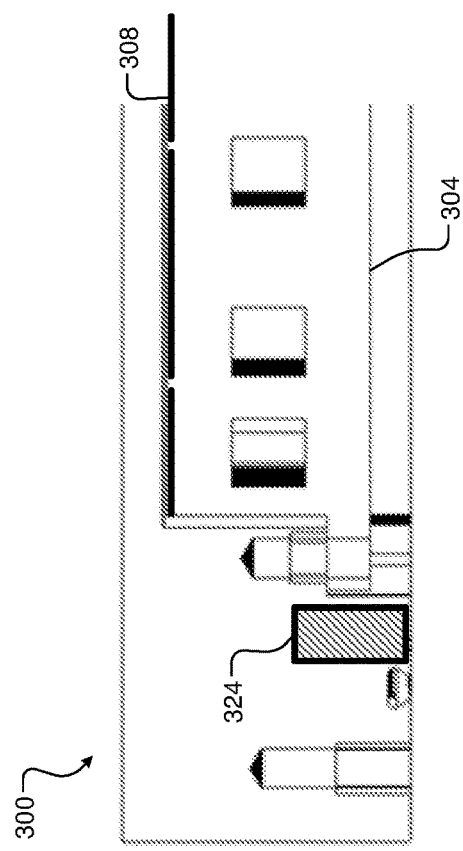
Figure 3D:
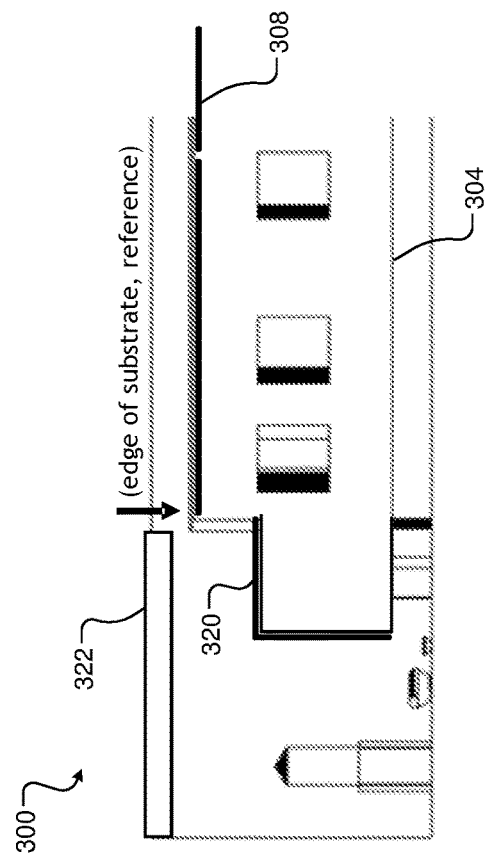

Referring now to FIGS. 3A, 3B, 3C, and 3D, example heater zone configurations of a substrate support 300 showing different outer heater zone locations are shown. The substrate support 300 includes a baseplate 304 with an embedded heater layer 308. In FIG. 3A, a heater layer 308 extends to an outer edge of the baseplate 304. In FIG. 3B, a cylindrical, vertically-oriented heater zone 312 surrounds an outer edge of the baseplate 304. For example, the heater zone 312 may be embedded within a silicone bond 316 or another material surrounding an upper portion of the baseplate 304. In FIG. 3C, a heater zone 320 is provided on a stepped portion of the baseplate 304 outside of an edge of a substrate arranged on the substrate support 300. For example, the heater zone 320 may be provided below a focus or edge ring 322 arranged on the substrate support 300 to surround a substrate. In FIG. 3D, an outer edge heater zone 324 is arranged outside of the baseplate 304.

Figure 4A:
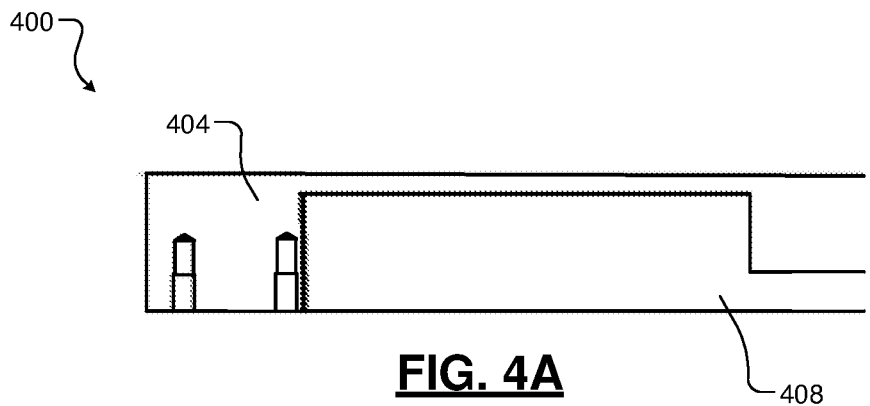
FIGS. 4A, 4B, 4C, and 4D show an example construction of a substrate support according to the present disclosure.
Figure 4B:
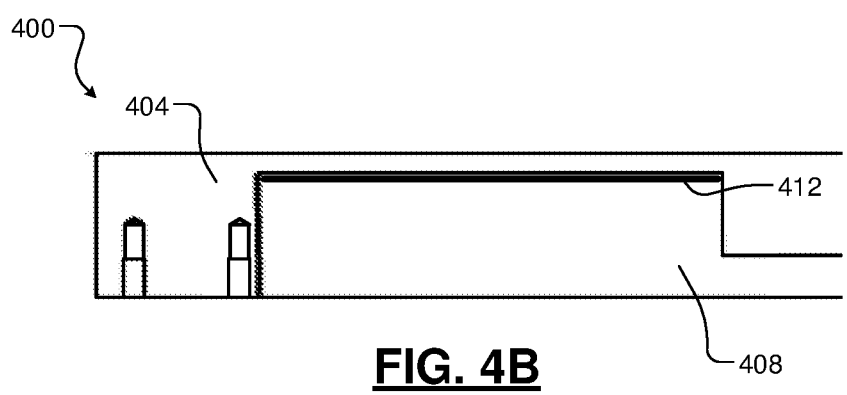
Figure 4C:
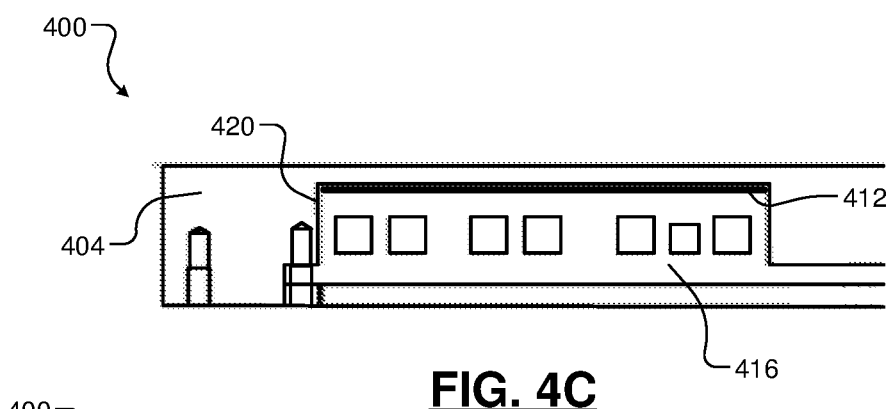
Figure 4D:
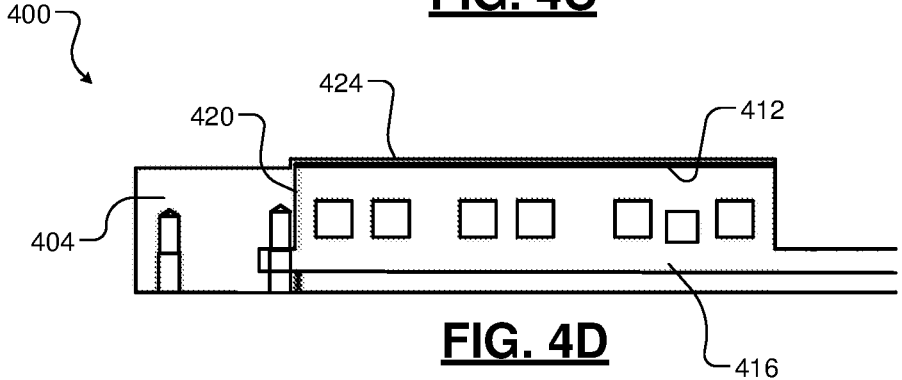

Referring now to FIGS. 4A, 4B, 4C, and 4D one example construction of the substrate support 400 is shown. In FIG. 4A, an upper plate 404 (e.g., an aluminum diffuser plate) of the substrate support 400 is machined to include a pocket 408. In FIG. 4B, a heater layer 412 is formed within the pocket 408. For example, the heater layer 412 is laminated onto an upper wall of the pocket 408. In FIG. 4C, a baseplate 416 (e.g., a cooling plate) is arranged within the pocket 408. For example, the baseplate 416 is bonded within the pocket 408 using a bonding material, such as a silicone bond 420. In FIG. 4D, the upper plate 404 is machined to remove a portion of the upper plate 404 and form a desired geometry of an upper surface 424. In this manner, the silicone bond 420 and the baseplate 416 are located on an atmosphere, RF shielded side of the upper plate 404. Accordingly, the silicone bond 420, baseplate 416, heater layer 412, etc. may comprise materials that are not compatible with fluorine and other materials used in the processing chamber. Further, in this example, the upper surface 424 and the upper plate 404 function as a Faraday cage enclosing both the heater layer 412 and the silicon bond 420.

Figure 5A:
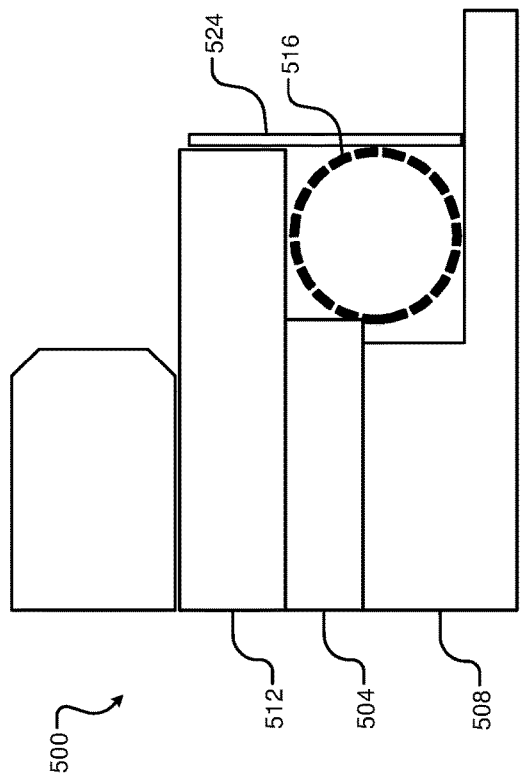
FIGS. 5A, 5B, 5C, and 5D show other example constructions of a substrate support according to the present disclosure.
Figure 5B:
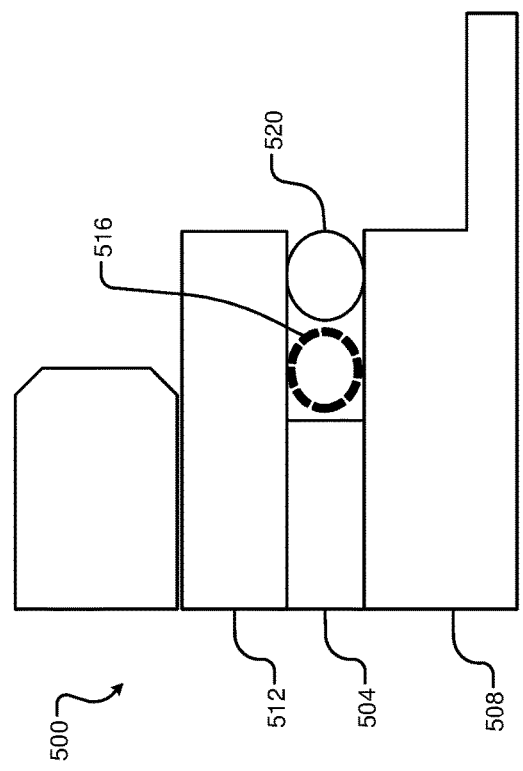
Figure 5C:
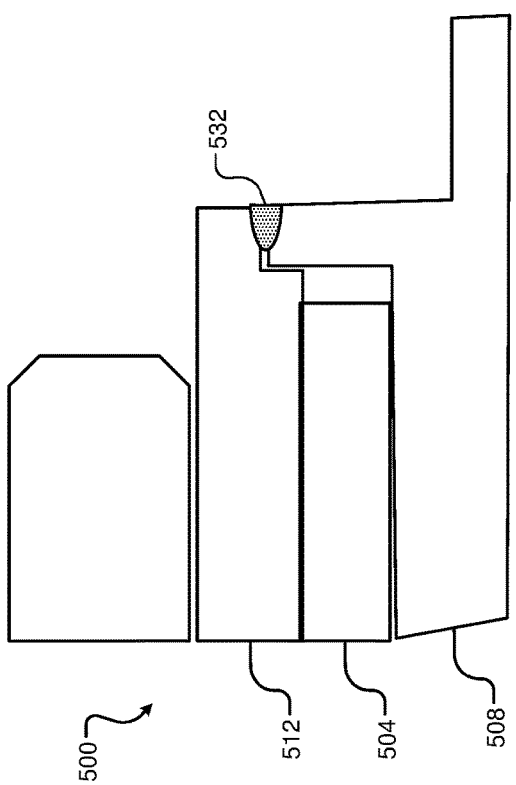
Figure 5D:
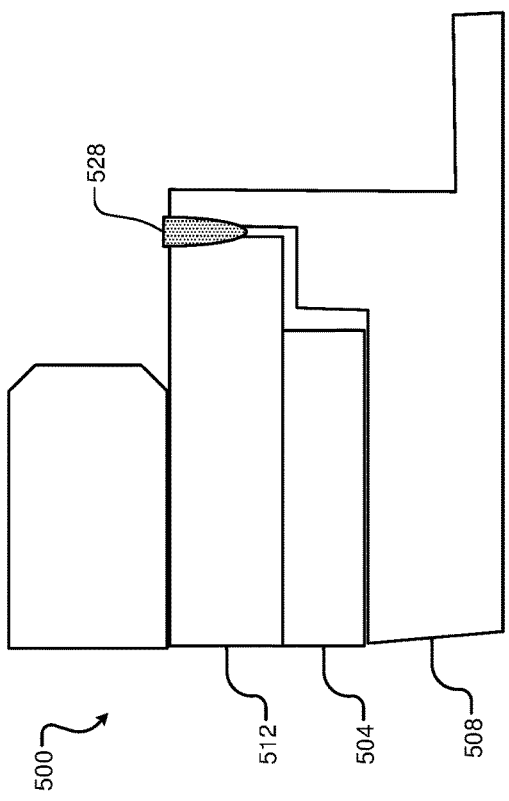

Referring now to FIGS. 5A, 5B, 5C, and 5D, other example constructions of the substrate support 500 are shown. In FIG. 5A, a heater layer 504 is arranged between a lower plate 508 and an upper plate 512. A shielding ring 516 surrounds the heater layer 504 and a protective O-ring 520 surrounds the shielding ring 516. In FIG. 5B, a protective tape 524 or other material surrounds the shielding ring 516. In FIGS. 5C and 5D, the lower plate 508 and the upper plate 512 are welded together at 528 and 532, respectively.

In some examples, the substrate support including the multi-zone heater layer described above may be used to adjust etching and deposition of mandrel patterns and associated spacer layers. For example, mandrels and spacer layers typically have an extremely thin profile. Accordingly, critical dimensions are more difficult to control, and relatively small process NUs may result in significant critical dimension NUs, such as spacer thickness NUs. Accordingly, the multi-zone heater layer according to the principles of the present disclosure can be used to compensate for various process NUs to improve spacer thickness uniformity, and temperatures may be controlled to tune critical dimensions of features across a surface of a substrate (i.e., regardless of whether there are process NUs). For example, if different portions of the substrate require different deposition thicknesses, temperatures of respective heater zones can be separately controlled to achieve the different deposition thicknesses across the substrate.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support for a substrate processing system configured to perform a deposition process, the substrate support comprising:
    a baseplate;
    a plurality of zones; and
    a heater layer provided on the baseplate, wherein the heater layer includes a plurality of resistive heaters arranged throughout the plurality of zones, wherein the plurality of resistive heaters includes separately-controllable resistive heaters arranged in respective ones of the plurality of zones,
    wherein the plurality of zones includes a central zone, at least one middle zone radially outside of the central zone, and at least one outer edge zone radially outside of the at least one middle zone, and
    wherein the plurality of resistive heaters includes a first resistive heater in the at least one outer edge zone, and wherein the first resistive heater extends radially outside of an outer edge of a substrate to be processed on the substrate support.

2. The substrate support of claim 1, wherein the deposition process is an atomic layer deposition (ALD) process and the substrate support is an ALD pedestal.

3. The substrate support of claim 1, wherein the at least one outer edge zone includes a first outer edge zone adjacent to the at least one middle zone and a second outer edge zone radially outside of the first outer edge zone.

4. The substrate support of claim 1, wherein the at least one middle zone includes a first plurality of azimuthal segments.

5. The substrate support claim 4, wherein the at least one outer edge zone includes a second plurality of azimuthal segments offset from the first plurality of azimuthal segments in an azimuthal direction.

6. The substrate support of claim 5, wherein the second plurality of azimuthal segments is offset from the first plurality of azimuthal segments by 45 degrees.

7. The substrate support of claim 1, wherein at least a portion of the heater layer is provided on a stepped portion of the baseplate.

8. The substrate support of claim 1, wherein at least one of (i) only an outer edge of the substrate contacts an upper surface of the substrate support and (ii) the substrate is arranged on minimum contact area features of the substrate support.

* * * * *